(12) United States Patent
Kurokawa et al.

(10) Patent No.: US 11,538,981 B2
(45) Date of Patent: Dec. 27, 2022

(54) VIBRATION ELEMENT, ELECTRONIC APPARATUS, AND VEHICLE

(71) Applicant: Seiko Epson Corporation, Tokyo (JP)

(72) Inventors: Kenichi Kurokawa, Suwa (JP); Yukio Kitahara, Chino (JP); Kazuo Tanaka, Ina (JP)

(73) Assignee: SEIKO EPSON CORPORATION

( * ) Notice: Subject to any disclaimer, the term of this patent is extended or adjusted under 35 U.S.C. 154(b) by 279 days.

(21) Appl. No.: 16/911,437

(22) Filed: Jun. 25, 2020

(65) Prior Publication Data

US 2020/0411746 A1 Dec. 31, 2020

(30) Foreign Application Priority Data

Jun. 26, 2019 (JP) .............................. JP2019-118290

(51) Int. Cl.
*H01L 41/083* (2006.01)
*H01L 41/09* (2006.01)
(Continued)

(52) U.S. Cl.
CPC ............ *H01L 41/18* (2013.01); *H01L 41/083* (2013.01); *H01L 41/09* (2013.01); *H01L 41/094* (2013.01);
(Continued)

(58) Field of Classification Search
CPC .................. H01L 41/04; H01L 41/047; H01L 41/0471; H01L 41/08; H01L 41/083; H01L 41/09; H01L 41/094; H01L 41/18; H01L 41/183; H01L 41/187; H01L 41/22; H01L 41/253; H01L 41/257; H03B 5/30; H03B 5/32; H03H 2003/026; H03H 2003/0492; H03H 9/02433; H03H 9/0519; H03H 9/1021; H03H 9/125; H03H 9/13; H03H 9/131; H03H 9/15; H03H 9/17; H03H 9/176;
(Continued)

(56) References Cited

U.S. PATENT DOCUMENTS 3,657,667 A * 4/1972 Nishikubo ............. H03B 5/323
331/116 M
3,659,230 A * 4/1972 Tanaka ..................... H03B 5/36
331/116 M
4,281,298 A * 7/1981 Gounji ..................... H03H 9/24
219/535
(Continued)

FOREIGN PATENT DOCUMENTS

JP 2009-100076 A 5/2009
JP 2011-004035 A 1/2011
(Continued)

*Primary Examiner* — Levi Gannon
(74) *Attorney, Agent, or Firm* — Harness, Dickey & Pierce, P.L.C.

(57) ABSTRACT

A vibration element includes: a base; a first arm continuous with the base; a second arm that is continuous with the base and is adjacent to the first arm; a first electrode disposed on the first arm, the second arm, and the base; a first piezoelectric layer that has a first polarity and that is disposed on the first electrode on the first arm; a second piezoelectric layer that has a second polarity different from the first polarity and that is disposed on the first electrode on the second arm; an insulating layer disposed on the first electrode on the base; and a second electrode disposed on the first piezoelectric layer, the second piezoelectric layer, and the insulating layer.

9 Claims, 7 Drawing Sheets

(51) Int. Cl.
*H01L 41/18* (2006.01)
*H01L 41/257* (2013.01)
*H03H 9/13* (2006.01)
*H03H 9/21* (2006.01)
*H03H 9/125* (2006.01)
*H03H 9/24* (2006.01)

(52) U.S. Cl.
CPC .......... *H01L 41/257* (2013.01); *H03H 9/125* (2013.01); *H03H 9/131* (2013.01); *H03H 9/21* (2013.01); *H03H 9/2489* (2013.01)

(58) Field of Classification Search
CPC ............ H03H 9/19; H03H 9/21; H03H 9/215; H03H 9/2468; H03H 9/2478; H03H 9/2484; H03H 9/2489
See application file for complete search history.

(56) References Cited

U.S. PATENT DOCUMENTS

| | | | |
|---|---|---|---|
| 2010/0201223 A1* | 8/2010 | Ishii | H03H 9/21 310/321 |
| 2010/0320875 A1* | 12/2010 | Takizawa | H03H 9/176 310/357 |
| 2011/0001394 A1* | 1/2011 | Dalia | H03H 9/131 310/325 |
| 2011/0156826 A1* | 6/2011 | Kawai | H03H 9/1021 331/116 R |
| 2011/0227450 A1* | 9/2011 | Yamazaki | H03H 9/02125 310/318 |
| 2012/0194283 A1* | 8/2012 | Funakawa | H03H 9/215 310/363 |
| 2015/0180449 A1* | 6/2015 | Umeda | H01L 41/31 29/25.35 |
| 2016/0065173 A1* | 3/2016 | Nishimura | H03H 9/21 310/370 |
| 2016/0260887 A1* | 9/2016 | Fujii | H01L 41/053 |
| 2016/0329877 A1 | 11/2016 | Nishimura et al. | |

FOREIGN PATENT DOCUMENTS

| | | |
|---|---|---|
| JP | 2014-064078 A | 4/2014 |
| JP | 2019-022075 A | 2/2019 |
| WO | 2015-111503 A1 | 7/2015 |

* cited by examiner

VIBRATION ELEMENT, ELECTRONIC APPARATUS, AND VEHICLE

The present application is based on, and claims priority from JP Application Serial Number 2019-118290, filed Jun. 26, 2019, the disclosure of which is hereby incorporated by reference herein in its entirety.

BACKGROUND

1. Technical Field

The present disclosure relates to a vibration element, an electronic apparatus, and a vehicle.

2. Related Art

In the related art, JP-A-2014-64078 discloses a vibration element including a base, vibrating arms extending from the base, a lower electrode disposed on the base and the vibrating arms, an upper electrode provided above the lower electrode, and an insulating layer between the lower electrode and the upper electrode. Thickness of the insulating layer provided above the base is larger than thickness of the insulating layer provided above the vibrating arms. By increasing the thickness of the insulating layer provided above the base, load capacitance in a cross wiring where a wiring of the lower electrode and a wiring of the upper electrode on the base overlap is reduced, and vibration characteristics are improved.

However, in the vibration element described in JP-A-2014-64078, in order to cause two outer vibrating arms and a central vibrating arm to vibrate in opposite phases, the lower electrode of the two outer vibrating arms and the upper electrode of the central vibrating arm are electrically coupled to the base by a through-hole wiring or the like. Therefore, a wiring structure is complicated and stability of electrical coupling is likely to be reduced.

SUMMARY

A vibration element includes: a base; a first arm continuous with the base; a second arm that is continuous with the base and is adjacent to the first arm; a first electrode disposed on the first arm, the second arm, and the base; a first piezoelectric layer that has a first polarity and is disposed on the first electrode on the first arm; a second piezoelectric layer that has a second polarity different from the first polarity and is disposed on the first electrode on the second arm; an insulating layer disposed on the first electrode on the base; and a second electrode disposed on the first piezoelectric layer, the second piezoelectric layer, and the insulating layer.

An electrical apparatus includes: a vibration element including a base, a first arm continuous with the base, a second arm that is continuous with the base and is adjacent to the first arm, a first electrode disposed on the first arm, the second arm, and the base, a first piezoelectric layer that has a first polarity and is disposed on the first electrode on the first arm, a second piezoelectric layer that has a second polarity different from the first polarity and is disposed on the first electrode on the second arm, an insulating layer disposed on the first electrode on the base, and a second electrode disposed on the first piezoelectric layer, the second piezoelectric layer, and the insulating layer; an oscillation circuit that drives the vibration element; and a control circuit that operates based on a frequency signal output from the oscillation circuit.

A vehicle includes: a vibration element including a base, a first arm continuous with the base, a second arm that is continuous with the base and is adjacent to the first arm, a first electrode disposed on the first arm, the second arm, and the base, a first piezoelectric layer that has a first polarity and is disposed on the first electrode on the first arm, a second piezoelectric layer that has a second polarity different from the first polarity and is disposed on the first electrode on the second arm, an insulating layer disposed on the first electrode on the base, and a second electrode disposed on the first piezoelectric layer, the second piezoelectric layer, and the insulating layer; an oscillation circuit that drives the vibration element; and a control circuit that operates based on a frequency signal output from the oscillation circuit.

DESCRIPTION OF EXEMPLARY EMBODIMENTS

1. First Embodiment

Here, as an example of a vibration element, a vibration element using silicon (Si) as a base material will be described.

Figure 1:
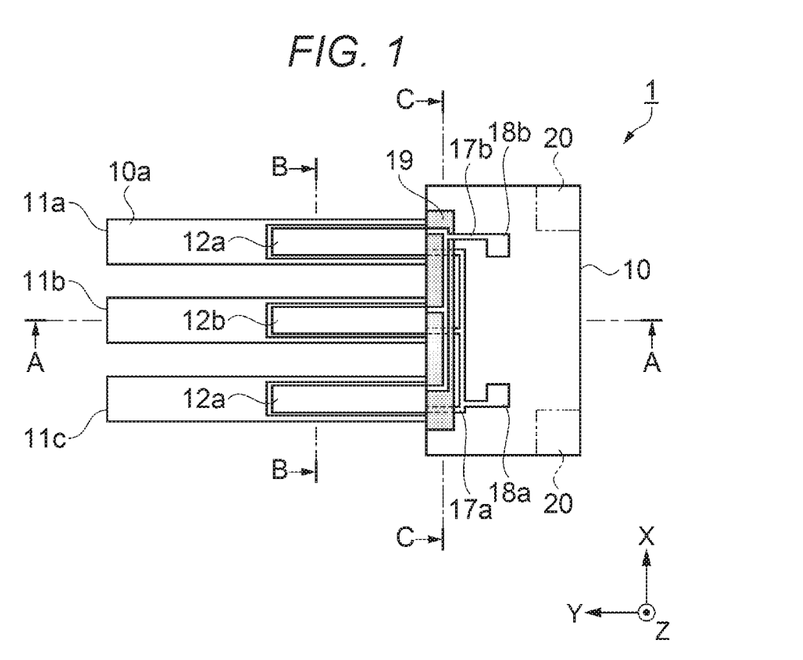
FIG. 1 is a plan view showing a schematic configuration of a vibration element according to a first embodiment.
Figure 2:
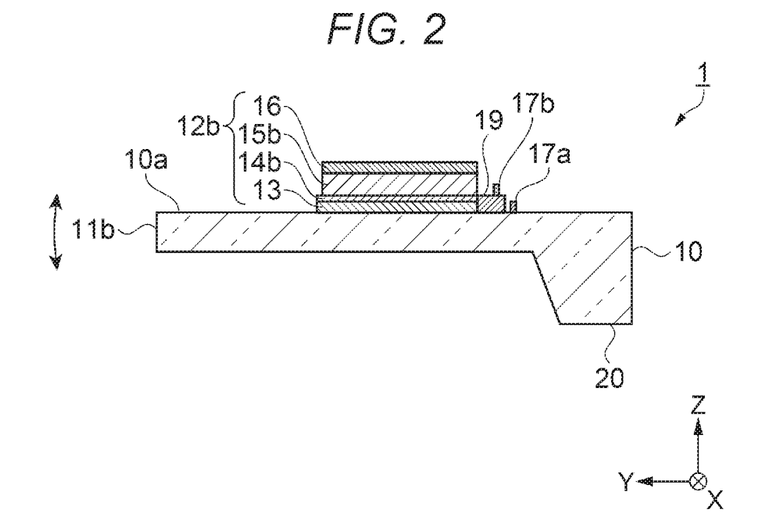
FIG. 2 is a cross-sectional view taken along line A-A of FIG. 1.
Figure 3:
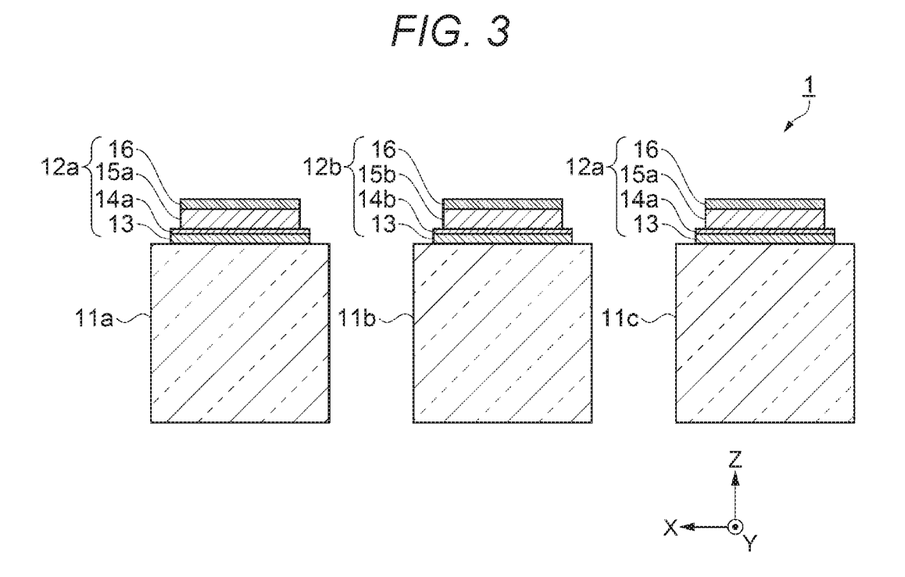
FIG. 3 is a cross-sectional view taken along line B-B of FIG. 1.
Figure 4:
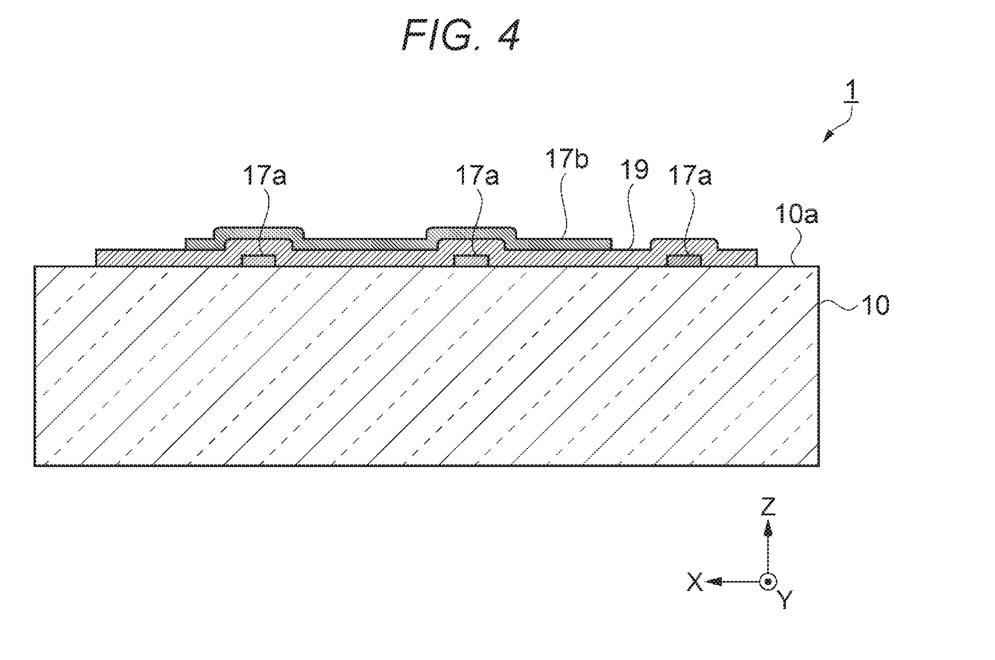
FIG. 4 is a cross-sectional view taken along line C-C of FIG. 1.
Figure 5A:
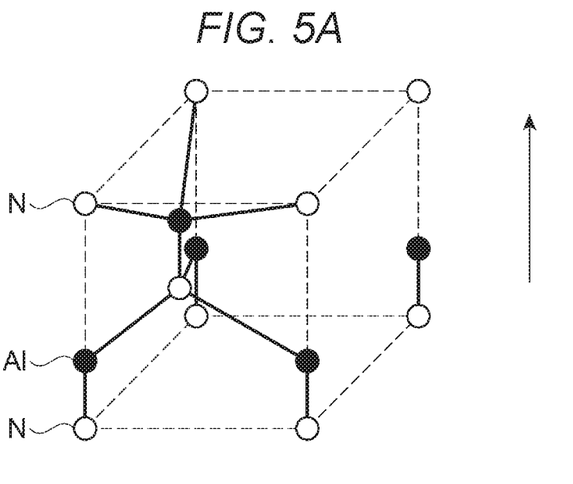
FIG. 5A is a schematic diagram of a crystal structure illustrating a first piezoelectric layer having a first polarity.
Figure 5B:
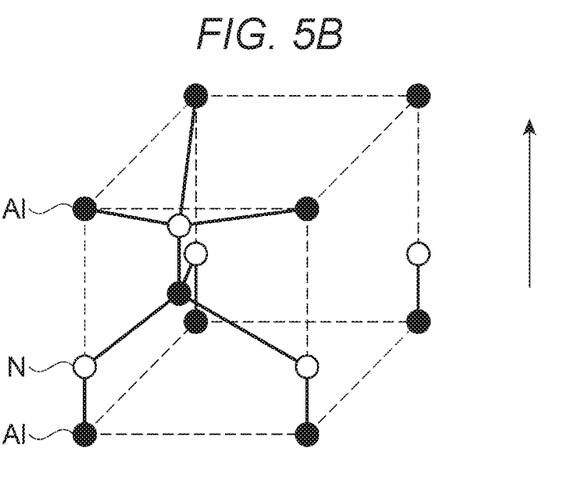
FIG. 5B is a schematic diagram of a crystal structure illustrating a second piezoelectric layer having a second polarity.
Figure 6:
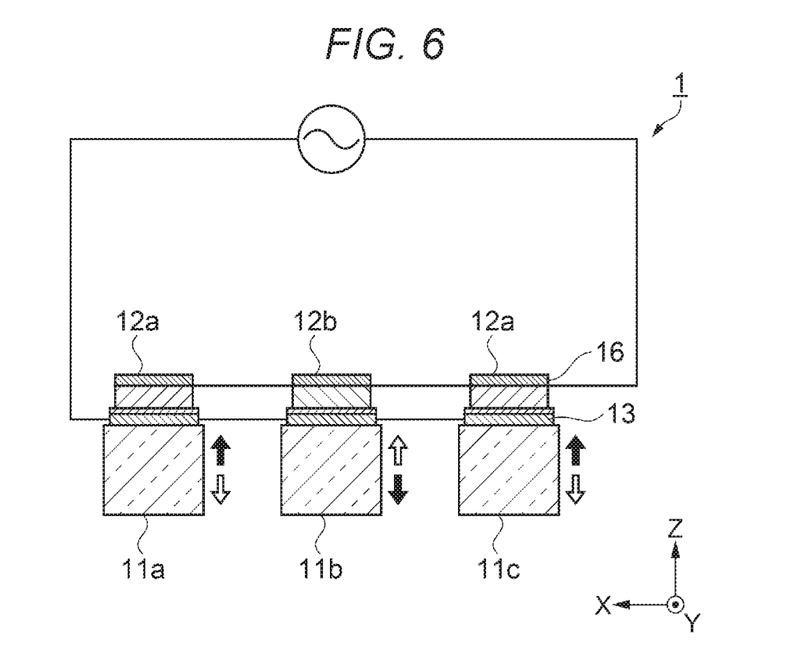
FIG. 6 is a cross-sectional view taken along line B-B of FIG. 1 and shows a wiring diagram of each excitation electrode.

FIG. 1 is a plan view showing a schematic configuration of a vibration element 1 according to a first embodiment. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5A is a schematic diagram of a crystal structure illustrating a first piezoelectric layer 15a having a first polarity. FIG. 5B is a schematic diagram of a crystal structure illustrating a second piezoelectric layer 15b having a second polarity. FIG. 6 is a cross-sectional view taken along line B-B of FIG. 1 and shows a wiring diagram of each of excitation electrodes 12a and 12b. Dimensional ratios of components are different from actual ones. In each figure, an X axis, a Y axis, and a Z axis are coordinate axes orthogonal to one another. A direction along the X axis is described as an X direction, a direction along the Y axis is described as a Y direction, and a direction along the Z axis is described as a Z direction.

As shown in FIG. 1, the vibration element 1 includes, as a base material, a base 10, and three arms 11a, 11b, and 11c that are coupled to the base 10 and that extend along the Y axis. In the present embodiment, the vibration element 1 includes a first arm 11a, a second arm 11b, and a third arm 11c. A silicon substrate such as a polysilicon substrate or a single crystal silicon substrate is used as the base 10.

The arms 11a, 11b, and 11c each are formed in a substantially prismatic shape, and are arranged in the X direction orthogonal to the Y direction in plan view. On a main surface 10a along an XY plane specified by the X axis and the Y axis, a first excitation electrode 12a is provided on the first arm 11a, a second excitation electrode 12b is provided on the second arm 11b, and the first excitation electrode 12a is provided on the third arm 11c.

The arms 11a, 11b, and 11c perform bending vibration, by the excitation electrodes 12a and 12b, in the Z direction orthogonal to the main surface 10a, that is, so-called out-of-plane vibration that vibrates in a direction not along the main surface 10a.

As shown in FIG. 3, the first excitation electrode 12a has a stacked structure including a first electrode 13 provided on a main surface 10a side of the first arm 11a, an aluminum (Al) layer 14a, the first piezoelectric layer 15a having the first polarity, and a second electrode 16. The first excitation electrode 12a is also provided on the main surface 10a side of the third arm 11c.

As shown in FIGS. 2 and 3, the second excitation electrode 12b has a stacked structure including the first electrode 13 provided on the main surface 10a side of the second arm 11b, a layer 14b containing nitrogen (N), titanium (Ti), and oxygen (O), the second piezoelectric layer 15b having the second polarity different from the first polarity, and the second electrode 16.

The first electrodes 13 of the first excitation electrode 12a and the second excitation electrode 12b are electrically coupled to an electrode pad 18a by a wiring 17a, which is the first electrode 13 provided on the main surface 10a side of the base 10.

The second electrodes 16 of the first excitation electrode 12a and the second excitation electrode 12b are electrically coupled to an electrode pad 18b by a wiring 17b, which is the second electrode 16 provided on the main surface 10a side of the base 10.

The vibration element 1 can be excited by electrically coupling an oscillation circuit that is not shown to the electrode pads 18a and 18b through a bonding wire that is not shown or the like.

As shown in FIG. 4, an insulating layer 19 is provided on the wiring 17a, which is the first electrode 13 provided on the main surface 10a side of the base 10, and the wiring 17b, which is the second electrode 16, is provided on the insulating layer 19. Since the insulating layer 19 is provided in a region where the first electrode 13 and the second electrode 16 overlap each other on the main surface 10a of the base 10, the first electrode 13 and the second electrode 16 can be prevented from being short-circuited.

In order to obtain efficient vibration characteristics, it is preferable that each of the excitation electrodes 12a and 12b extends from a boundary with the base 10, which is a root of each of the arms 11a, 11b, and 11c, toward a tip end, and has a length of about half of an entire length of each of the arms 11a, 11b, and 11c which is a length from the root to the tip end along the Y axis.

Thickness of the base 10 in the Z direction is formed to be larger than thickness of each of the arms 11a, 11b, and 11c in the Z direction, as shown in FIG. 2.

As indicated by a two-dot chain line in FIG. 1, fixing portions 20 which are regions for fixing the vibration element 1 to an external member such as a package are provided on a back surface side of the main surface 10a at both ends along the X axis of the base 10. The fixing portion 20 is preferably provided at an end on an opposite side of the base 10 from the arms 11a, 11b, and 11c in the Y direction.

The base 10, the arms 11a, 11b, and 11c, the excitation electrodes 12a and 12b, the wirings 17a and 17b, and the electrode pads 18a and 18b are formed with high precision using, for example, a sputtering technique, a photolithography technique, and an etching technique.

In the vibration element 1, from the viewpoint of obtaining good vibration characteristics, thickness of the first electrode 13 and the second electrode 16 of the first excitation electrode 12a and the second excitation electrode 12b is preferably set to 10 nm or more and 30 nm or less, and thickness of the aluminum layer 14a is preferably set to 1 nm or more and 5 nm or less. Thickness of the layer 14b containing nitrogen, titanium, and oxygen is preferably set to 1 nm or more and 5 nm or less, and thickness of the first piezoelectric layer 15a and the second piezoelectric layer 15b is preferably set to 100 nm or more and 1000 nm or less.

Materials of the first electrode 13 and the second electrode 16 are titanium nitride (TiN). Materials of the first piezoelectric layer 15a and the second piezoelectric layer 15b are the same, and are either aluminum nitride (AlN) or gallium nitride (GaN). Since the first piezoelectric layer 15a and the second piezoelectric layer 15b are formed of the same material, when the thickness is the same, piezoelectric effect is equivalent, and the vibration element 1 having stable vibration characteristics can be obtained. A material of the insulating layer 19 is preferably silicon dioxide ($SiO_2$), and thickness of the insulating layer 19 is preferably set to 25 nm or more and 500 nm or less.

Here, the first piezoelectric layer 15a and the second piezoelectric layer 15b having different polarities will be described by way of an example in which the material is aluminum nitride. In FIGS. 5A and 5B, black circles indicate aluminum (Al) atoms, and white circles indicate nitrogen (N) atoms. An arrow indicates a direction in which the crystal grows.

The first piezoelectric layer 15a of the first excitation electrode 12a is disposed in contact with the aluminum layer 14a. The first piezoelectric layer 15a is formed by growing aluminum nitride on the aluminum layer 14a. Specifically, when aluminum is sputtered in a nitrogen gas on the aluminum layer 14a, first, the aluminum in the aluminum layer 14a and the nitrogen in the nitrogen gas are bonded, thereafter, the nitrogen bonded to the aluminum in the aluminum layer 14a and the sputtered aluminum are bonded, and, as shown in FIG. 5A, the aluminum nitride grows with crystal directions aligned. A crystal of the aluminum nitride is obtained which has a first polarity referred to as an N polarity. When molybdenum (Mo) is used instead of aluminum, a crystal of aluminum nitride having an N polarity is also obtained in the similar manner.

The second piezoelectric layer 15b of the second excitation electrode 12b is disposed in contact with the layer 14b containing nitrogen, titanium, and oxygen. The second piezoelectric layer 15b is formed by growing aluminum nitride on the layer 14b containing nitrogen, titanium, and oxygen. Specifically, when aluminum is sputtered in a nitrogen gas on the layer 14b containing nitrogen, titanium, and oxygen, first, oxygen in the layer 14b containing nitrogen, titanium, and oxygen and the sputtered aluminum are bonded, thereafter, aluminum bonded with the oxygen in the layer 14b containing nitrogen, titanium, and oxygen and nitrogen in the nitrogen gas are bonded, and, as shown in FIG. 5B, the aluminum nitride grows with crystal directions aligned. A crystal of the aluminum nitride is obtained which has a second polarity that is different from the first polarity and that is referred to as an Al polarity. The layer 14b containing nitrogen, titanium, and oxygen can be formed by applying an asking treatment with an oxygen gas to the first electrode 13 of titanium nitride. When the piezoelectric layers 15a and 15b are gallium nitride, the second polarity is referred to as a Ga polarity.

Since the first piezoelectric layer 15a and the second piezoelectric layer 15b have different polarities, the first piezoelectric layer 15a and the second piezoelectric layer 15b vibrate in opposite phases with respect to an electric field in the same direction. That is, when an electric field is applied between the first electrode 13 and the second electrode 16, the second piezoelectric layer 15b contracts when the first piezoelectric layer 15a expands, and conversely, the second piezoelectric layer 15b expands when the first piezoelectric layer 15a contracts, so that the second arm 11b and the first and third arms 11a and 11c can be vibrated in opposite phases.

Therefore, the first electrodes 13 of the first arm 11a and the third arm 11c and the first electrode 13 of the second arm 11b can be coupled to have the same potential. The second electrodes 16 of the first arm 11a and the third arm 11c and the second electrode 16 of the second arm 11b can be coupled to have the same potential. Therefore, by simplifying a wiring structure of the first electrode 13 and the second electrode 16, specifically, by setting a simple wiring structure in which the insulating layer 19 is provided in a region where the first electrode 13 and the second electrode 16 overlap, stability of electrical coupling between the first electrode 13 and the electrode pad 18a and between the second electrode 16 and the electrode pad 18b can be improved.

Next, operation of the vibration element 1 will be described.

As shown in FIG. 6, the excitation electrodes 12a and 12b of the vibration element 1 are configured such that the first electrode 13 and the second electrode 16 are coupled to an AC power supply by wirings, and an alternating voltage as a driving voltage is applied.

Specifically, the first electrode 13 of the first arm 11a, the first electrode 13 of the second arm 11b, and the first electrode 13 of the third arm 11c are coupled to have the same potential. The second electrode 16 of the first arm 11a, the second electrode 16 of the second arm 11b, and the second electrode 16 of the third arm 11c are coupled to have the same potential.

In this state, when an alternating voltage is applied between the first electrode 13 and the second electrode 16, an electric field is generated between the first electrode 13 and the second electrode 16, the first piezoelectric layer 15a and the second piezoelectric layer 15b are polarized, distortion occurs in the first piezoelectric layer 15a and the second piezoelectric layer 15b due to a reverse piezoelectric effect, and the first piezoelectric layer 15a and the second piezoelectric layer 15b expand and contract along the Y axis.

In the vibration element 1, since the polarity of the first piezoelectric layer 15a and the polarity of the second piezoelectric layer 15b are different, even if a direction of the electric field generated in the second excitation electrode 12b of the central second arm 11b and directions of the electric fields generated in the first excitation electrodes 12a of the first arm 11a and the third arm 11c, which are on both sides sandwiching the central second arm 11b, are the same, expansion and contraction of the first piezoelectric layer 15a and the second piezoelectric layer 15b can be reversed between the central second arm 11b and the first arm 11a and the third arm 11c on both sides sandwiching the central second arm 11b.

Specifically, when the second piezoelectric layer 15b of the central second arm 11b expands, the first piezoelectric layers 15a of the first arm 11a and the third arm 11c on both sides sandwiching the central second arm 11b contract. When the second piezoelectric layer 15b of the central second arm 11b contracts, the first piezoelectric layers 15a of the first arm 11a and the third arm 11c on both sides sandwiching the central second arm 11b expand.

In the vibration element 1, due to the expansion and contraction of the first piezoelectric layer 15a and the second piezoelectric layer 15b, the arms 11a, 11b, and 11c bend in directions of black arrows when the alternating voltage is at one potential, and the arms 11a, 11b, and 11c bend in directions of white arrows when the alternating voltage is at the other potential.

By repeating the above bending, the arms 11a, 11b, and 11c in the vibration element 1 perform bending vibration in the Z direction, that is, so-called out-of-plane vibration. At this time, adjacent arms among the arms 11a, 11b, and 11c perform bending vibration in opposite directions or opposite phases.

In addition to silicon, a Silicon on Insulator (SOI) or a quartz crystal may be used as the base material of the vibration element 1. In a case of SOI, each of the arms 11a, 11b, and 11c is formed by a surface silicon layer, and a Buried Oxide (BOX) layer and a silicon layer below each of the arms 11a, 11b, and 11c are etched to form the vibration element 1 having a structure in which a gap is provided below each of the arms 11a, 11b, and 11c.

The number of arms 11a, 11b, and 11c of the vibration element 1 is not limited to three, and may be two or more.

The thickness of the base 10 of the vibration element 1 may be the same as the thickness of the arms 11a, 11b, and 11c. Accordingly, since the vibration element 1 has a flat plate shape, the manufacturing is easy.

2. Second Embodiment

Figure 7:
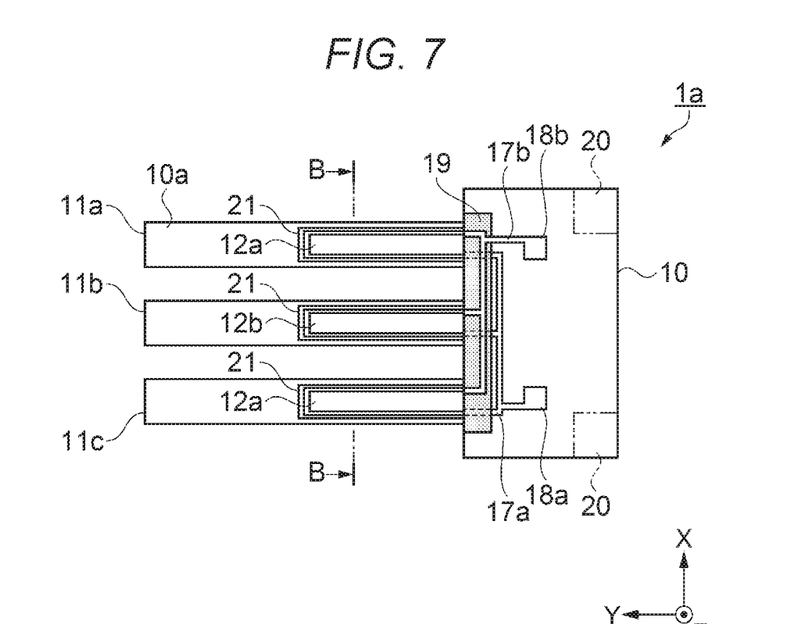
FIG. 7 is a plan view showing a schematic configuration of a vibration element according to a second embodiment.
Figure 8:
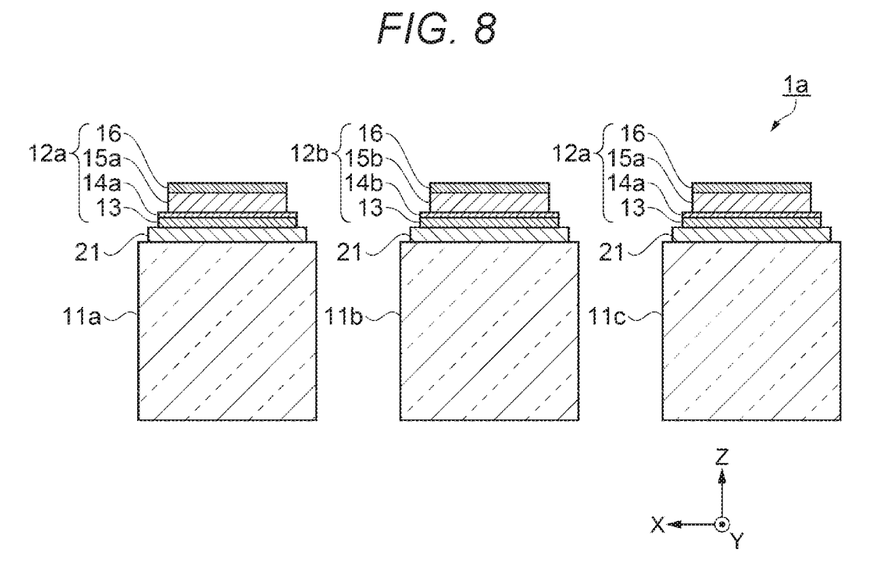
FIG. 8 is a cross-sectional view taken along line B-B of FIG. 7.

FIG. 7 is a plan view showing a schematic configuration of a vibration element 1a according to a second embodiment. FIG. 8 is a cross-sectional view taken along line B-B of FIG. 7. The same components as those in the first embodiment are denoted by the same reference numerals and will not be described in detail, and differences from the first embodiment will be mainly described.

As shown in FIGS. 7 and 8, the vibration element 1a according to the second embodiment differs from the first embodiment in a configuration around the excitation electrodes 12a and 12b.

In the vibration element 1a, silicon dioxide ($SiO_2$) layers 21 are disposed between the main surfaces 10a of the first arm 11a, the second arm 11b, and the third arm 11c and the first electrodes 13 of the first excitation electrodes 12a and the second excitation electrode 12b.

The silicon dioxide layer 21 is formed with high precision by using, for example, a sputtering technique, a photolithography technique, or an etching technique. Thickness of the silicon dioxide layer 21 is preferably 100 nm or more and 2000 nm or less.

According to such a configuration, since the vibration element 1a includes the silicon dioxide layer 21 provided between the main surface 10a and the first electrode 13 of each of the arms 11a, 11b, and 11c, the silicon dioxide layer 21 functions as a temperature characteristic correction film of each of the arms 11a, 11b, and 11c. That is, in the vibration element 1a, an inclination of frequency-temperature characteristic of each of the arms 11a, 11b, and 11c whose base material is silicon is corrected or offset by an inclination of frequency-temperature characteristic of the silicon dioxide layer 21, resulting in a flat frequency-temperature characteristic.

Accordingly, the vibration element 1a may prevent a change in frequency caused by a temperature change, and can improve the frequency-temperature characteristic.

In the vibration element 1a, the silicon dioxide layer 21 may be provided on a surface on an opposite side of each of the arms 11a, 11b, and 11c from the main surface 10a side. With such a configuration, the vibration element 1a can also obtain the similar effect as described above.

3. Third Embodiment

Next, an electronic apparatus according to a third embodiment to which the vibration element 1 or 1a is applied will be described with reference to FIG. 9. Hereinafter, a configuration in which the vibration element 1 is applied will be described as an example.

Figure 9:
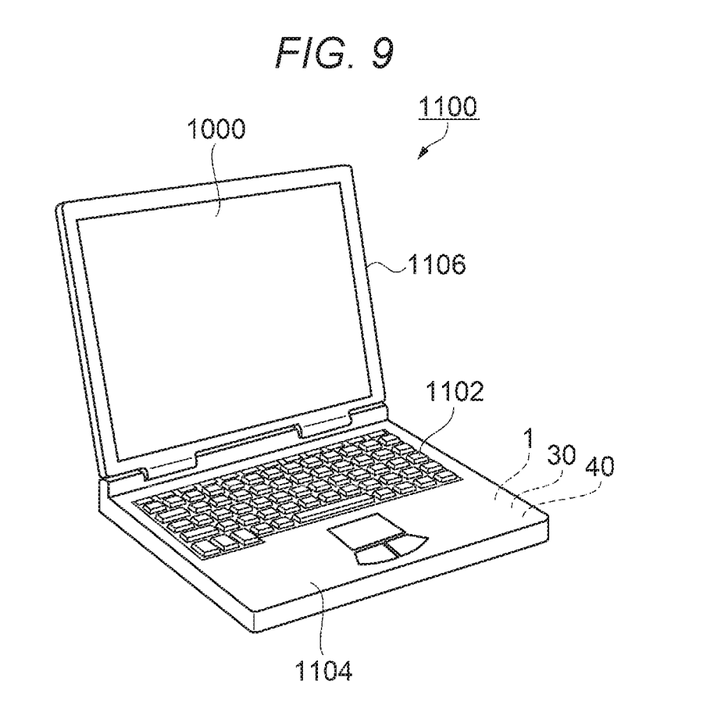
FIG. 9 is a perspective view showing a configuration of a notebook personal computer as an electronic apparatus according to a third embodiment and the electronic apparatus includes a vibration element.

FIG. 9 is a perspective view schematically showing a configuration of a notebook personal computer 1100 as the electronic apparatus according to the present embodiment and the electronic apparatus includes the vibration element 1.

As shown in FIG. 9, the personal computer 1100 includes a main body 1104 including a keyboard 1102, and a display unit 1106 including a display 1000. The display unit 1106 is rotatably supported by the main body 1104 through a hinge structure. The vibration element 1 that functions as a reference clock or the like, an oscillation circuit 30 that drives the vibration element 1, and a control circuit 40 that operates based on a frequency signal output from the oscillation circuit 30 are incorporated in such a personal computer 1100.

As described above, by utilizing the vibration element 1 having excellent reliability in the electronic apparatus, it is possible to provide an electronic apparatus with higher performance.

4. Fourth Embodiment

Next, a vehicle according to a fourth embodiment to which the vibration element 1 or 1a is applied will be described with reference to FIG. 10. Hereinafter, a configuration in which the vibration element 1 is applied will be described as an example.

Figure 10:
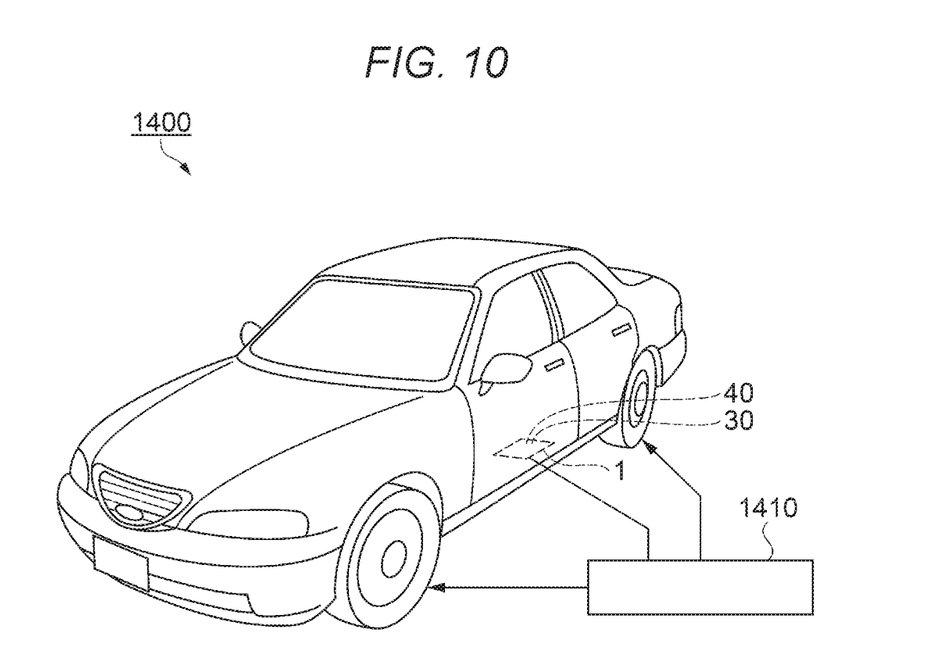
FIG. 10 is a perspective view showing a configuration of an automobile as a vehicle according to a fourth embodiment and the vehicle includes a vibration element.

FIG. 10 is a perspective view schematically showing an automobile 1400 as a vehicle according to the present embodiment and the vehicle includes the vibration element 1.

As shown in FIG. 10, the automobile 1400 is equipped with the vibration element 1, the oscillation circuit 30 that drives the vibration element 1, and the control circuit 40 that operates based on a frequency signal output from the oscillation circuit 30. The control circuit 40 controls an Electronic Control Unit (ECU) 1410 such as a keyless entry, an immobilizer, a navigation system, an air conditioner, an Antilock Brake System (ABS), an airbag, a Tire Pressure Monitoring System (TPMS), an engine control, a battery monitor for hybrid automobiles and electric automobiles, and a body attitude control system.

As described above, by utilizing the vibration element 1 having excellent reliability in the vehicle, it is possible to provide a vehicle with higher performance.

Contents derived from the embodiments will be described below.

A vibration element includes: a base; a first arm continuous with the base; a second arm that is continuous with the base and is adjacent to the first arm; a first electrode disposed on the first arm, the second arm, and the base; a first piezoelectric layer that has a first polarity and is disposed on the first electrode on the first arm; a second piezoelectric layer that has a second polarity different from the first polarity and is disposed on the first electrode on the second arm; an insulating layer disposed on the first electrode on the base; and a second electrode disposed on the first piezoelectric layer, the second piezoelectric layer, and the insulating layer.

According to the configuration, since the first piezoelectric layer is disposed on the first electrode of the first arm and the second piezoelectric layer is disposed on the second electrode of the second arm, when a voltage is applied between the first electrode and the second electrode, an electric field in the same direction is applied to the first arm and the second arm. Since the first piezoelectric layer has the first polarity and the second piezoelectric layer has the second polarity different from the first polarity, the second piezoelectric layer contracts when the first piezoelectric layer expands, and conversely, the second piezoelectric layer expands when the first piezoelectric layer contracts. Therefore, the first arm and the second arm can be vibrated in opposite phases. Further, since the polarities of the first piezoelectric layer and the second piezoelectric layer are different, the first electrode of the first arm and the first electrode of the second arm can be coupled to have the same potential, and the second electrode of the first arm and the second electrode of the second arm can be coupled to have the same potential. Therefore, the wiring structure between the first electrode and the second electrode can be simplified, and the stability of electrical coupling can be improved.

In the above vibration element, it is preferable that materials of the first piezoelectric layer and the second piezoelectric layer are the same, and are either aluminum nitride or gallium nitride.

According to the configuration, since the materials of the first piezoelectric layer and the second piezoelectric layer are the same, the piezoelectric effects of the first piezoelectric layer and the second piezoelectric layer can be equivalent, and stable vibration characteristics can be obtained. In addition, since aluminum nitride and gallium nitride can easily form piezoelectric layers having different polarities, the wiring structure between the first electrode and the second electrode can be simplified, and the stability of electrical coupling can be improved.

In the above vibration element, it is preferable that the first electrode is made of titanium nitride, the vibration element further includes an aluminum layer disposed on the first electrode on the first arm, and the first piezoelectric layer is in contact with the aluminum layer.

According to the configuration, since the first electrode is made of titanium nitride having high conductivity, a sufficient electric field can be applied to the first piezoelectric layer. Since the aluminum layer is disposed on the first electrode, the piezoelectric layer having the first polarity can be formed on the aluminum layer.

In the above vibration element, it is preferable that the first electrode is made of titanium nitride, the vibration element further includes a layer containing nitrogen, titanium, and oxygen disposed on the first electrode on the second arm, and the second piezoelectric layer is in contact with the layer containing nitrogen, titanium, and oxygen.

According to the configuration, since the first electrode is made of titanium nitride having high conductivity, a sufficient electric field can be applied to the second piezoelectric layer. Since the layer containing nitrogen, titanium, and oxygen is disposed on the first electrode, a piezoelectric layer having a second polarity different from the first polarity can be formed on the layer containing nitrogen, titanium, and oxygen.

In the above vibration element, it is preferable that a silicon dioxide layer is disposed between the first arm and the first electrode and between the second arm and the first electrode.

According to the configuration, since the vibration element includes the silicon dioxide layer disposed between the first arm and the first electrode and between the second arm and the first electrode, the frequency-temperature characteristic of the vibration element can be corrected by the frequency-temperature characteristic of the silicon dioxide layer, and a change in frequency caused by the temperature change can be prevented, thereby improving the frequency-temperature characteristic.

An electronic apparatus includes: a vibration element including a base, a first arm continuous with the base, a second arm that is continuous with the base and that is adjacent to the first arm, a first electrode disposed on the first arm, the second arm, and the base, a first piezoelectric layer that has a first polarity and that is disposed on the first electrode on the first arm, a second piezoelectric layer that has a second polarity different from the first polarity and that is disposed on the first electrode on the second arm, an insulating layer disposed on the first electrode on the base, and a second electrode disposed on the first piezoelectric layer, the second piezoelectric layer, and the insulating layer; an oscillation circuit that drives the vibration element; and a control circuit that operates based on a frequency signal output from the oscillation circuit.

According to the configuration, by utilizing the vibration element having excellent reliability in the electronic apparatus, it is possible to provide an electronic apparatus with higher performance.

A vehicle includes: a vibration element including a base, a first arm continuous with the base, a second arm that is continuous with the base and that is adjacent to the first arm, a first electrode disposed on the first arm, the second arm, and the base, a first piezoelectric layer that has a first polarity and that is disposed on the first electrode on the first arm, a second piezoelectric layer that has a second polarity different from the first polarity and that is disposed on the first electrode on the second arm, an insulating layer disposed on the first electrode on the base, and a second electrode disposed on the first piezoelectric layer, the second piezoelectric layer, and the insulating layer; an oscillation circuit that drives the vibration element; and a control circuit that operates based on a frequency signal output from the oscillation circuit.

According to the configuration, by utilizing the vibration element having excellent reliability in the vehicle, it is possible to provide a vehicle with higher performance.

What is claimed is:

1. A vibration element comprising:
   a base;
   a first arm continuous with the base;
   a second arm that is continuous with the base and is adjacent to the first arm;
   a first electrode disposed on the first arm, the second arm, and the base;
   a first piezoelectric layer that has a first polarity and is disposed on the first electrode on the first arm;
   a first surface layer disposed between the first piezoelectric layer and the first electrode on the first arm;
   a second piezoelectric layer that has a second polarity different from the first polarity and is disposed on the first electrode on the second arm;
   a second surface layer disposed between the second piezoelectric layer and the first electrode on the second arm;
   an insulating layer disposed on the first electrode on the base; and
   a second electrode disposed on the first piezoelectric layer, the second piezoelectric layer, and the insulating layer, wherein
   materials of the first piezoelectric layer and the second piezoelectric layer are the same, and
   materials of the first surface layer and the second surface are different from each other.

2. The vibration element according to claim 1, wherein the materials of the first piezoelectric layer and the second piezoelectric layer are either aluminum nitride or gallium nitride.

3. The vibration element according to claim 1, wherein the first surface layer is an aluminum layer, and the first piezoelectric layer is in contact with the aluminum layer.

4. The vibration element according to claim 3, wherein the first electrode is made of titanium nitride.

5. The vibration element according to claim 1, wherein the second surface layer is a layer containing nitrogen, titanium, and oxygen, and the second piezoelectric layer is in contact with the layer containing nitrogen, titanium, and oxygen.

6. The vibration element according to claim 5, wherein the first electrode is made of titanium nitride.

7. The vibration element according to claim 1, wherein a silicon dioxide layer is disposed between the first arm and the first electrode and between the second arm and the first electrode.

8. An electrical apparatus comprising:
   a vibration element including:
      a base,
      a first arm continuous with the base,
      a second arm that is continuous with the base and is adjacent to the first arm,
      a first electrode disposed on the first arm, the second arm, and the base,
      a first piezoelectric layer that has a first polarity and is disposed on the first electrode on the first arm,
      a first surface layer disposed between the first piezoelectric layer and the first electrode on the first arm,
      a second piezoelectric layer that has a second polarity different from the first polarity and is disposed on the first electrode on the second arm, a second surface layer disposed between the second piezoelectric layer and the first electrode on the second arm,
an insulating layer disposed on the first electrode on the base, and
a second electrode disposed on the first piezoelectric layer, the second piezoelectric layer, and the insulating layer;

an oscillation circuit that drives the vibration element; and
a control circuit that operates based on a frequency signal output from the oscillation circuit, wherein
material of the first piezoelectric layer and the second piezoelectric are the same, and
materials of the first surface layer and the second surface layer different from each other.

9. A vehicle comprising:
a vibration element including:
a base,
a first arm continuous with the base,
a second arm that is continuous with the base and is adjacent to the first arm,
a first electrode disposed on the first arm, the second arm, and the base,
a first piezoelectric layer that has a first polarity and is disposed on the first electrode on the first arm,
a first surface layer disposed between the first piezoelectric layer and the first electrode on the first arm,
a second piezoelectric layer that has a second polarity different from the first polarity and is disposed on the first electrode on the second arm,
a second surface layer disposed between the second piezoelectric layer and the first electrode on the second arm,
an insulating layer disposed on the first electrode on the base, and
a second electrode disposed on the first piezoelectric layer, the second piezoelectric layer, and the insulating layer;

an oscillation circuit that drives the vibration element; and
a control circuit that operates based on a frequency signal output from the oscillation circuit, wherein
materials of the first piezoelectric layer and the second piezoelectric layer are the same, and
materials of the first surface layer and the second surface layer are different from each other.

* * * * *